(12) United States Patent
Mao et al.

(10) Patent No.: US 9,258,915 B2
(45) Date of Patent: Feb. 9, 2016

(54) HIDDEN HANDLE MODULE

(71) Applicant: Wistron Corporation, New Taipei (TW)

(72) Inventors: Zhong-Hui Mao, New Taipei (TW);
Peng-Cheng Zhang, New Taipei (TW);
Yu Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/309,895

(22) Filed: Jun. 20, 2014

(65) Prior Publication Data

US 2015/0327378 A1   Nov. 12, 2015

(30) Foreign Application Priority Data

May 6, 2014 (CN) ...................... 2014 2 0230135 U

(51) Int. Cl.
*H05K 5/02* (2006.01)

(52) U.S. Cl.
CPC ............... *H05K 5/023* (2013.01); *Y10T 16/462* (2015.01)

(58) Field of Classification Search
CPC ... Y10T 16/462; Y10T 16/4644; Y10T 16/44; Y10T 16/473; H05K 5/023; H05K 7/1461; G06F 1/18; G06F 1/184; G06F 1/187; A47B 95/02; A47B 2095/024
USPC ............ 16/415, 419, 110.1, 429; 361/679.33, 361/679.37, 679.39; 312/348.6
See application file for complete search history.

(56) References Cited

U.S. PATENT DOCUMENTS

| | | | | |
|---|---|---|---|---|
| 5,379,184 | A * | 1/1995 | Barraza et al. | 361/679.33 |
| 5,741,055 | A * | 4/1998 | Chen | 312/348.6 |
| 6,570,770 | B1 * | 5/2003 | Ross et al. | 361/752 |
| 2005/0024819 | A1 * | 2/2005 | Peng et al. | 361/685 |
| 2007/0159786 | A1 * | 7/2007 | Liu et al. | 361/685 |
| 2008/0128579 | A1 * | 6/2008 | Chen et al. | 248/694 |
| 2011/0043994 | A1 * | 2/2011 | Cheng et al. | 361/679.33 |
| 2012/0236474 | A1 * | 9/2012 | Chang et al. | 361/679.01 |
| 2012/0236488 | A1 * | 9/2012 | Wallace et al. | 361/679.31 |
| 2013/0342990 | A1 * | 12/2013 | Jau et al. | 361/679.39 |
| 2014/0001933 | A1 * | 1/2014 | Zhou | 312/223.1 |

* cited by examiner

*Primary Examiner* — William Miller
(74) *Attorney, Agent, or Firm* — Jianq Chyun IP Office

(57) ABSTRACT

A hidden handle module is adapted to a tray accommodated in a chassis. The hidden handle module includes a shaft, a handle, and first and second elastic components. The shaft is pivoted on the tray and interfered with the chassis to stop the tray moving out of the chassis. The handle is pivoted on the shaft and stopped in the tray by a stopping portion of the tray to limit the position of the shaft. The first elastic component is disposed in the tray and stops the handle moving away from the stopping portion. The second elastic portion is connected between the shaft and the tray. When the handle resists elastic force of the first elastic component and moves away from the stopping portion, the handle protrudes out of the tray by elastic force of the second elastic component, and the shaft rotates to be released by the chassis.

12 Claims, 7 Drawing Sheets

HIDDEN HANDLE MODULE

CROSS-REFERENCE TO RELATED APPLICATION

This application claims the priority benefit of China application serial no. 201420230135.2, filed on May 6, 2014. The entirety of the above-mentioned patent application is hereby incorporated by reference herein and made a part of this specification.

BACKGROUND

1. Field of the Invention

The invention relates to a handle module, and more particularly, to a hidden handle module

2. Description of Related Art

A server is a core computer which serves all the computers or portable electronic apparatuses in a network system and provides network users with discs and functions such as printing, etc. Also, the server allows the users to share resources in the network. The basic frame of the server is approximately the same as that of an ordinary personal computer, consisting of members such as a central processing unit (CPU), a memory, input/output (I/O) equipment, etc.

To take rack servers as an example, a plurality of server modules thereof are disposed on a plurality of sliding trays respectively, wherein each tray is accommodated in a chassis. When components in the server modules need to be replaced or repaired, it is required to pull the tray out of the chassis and place the tray into the chassis after the components are replaced or repaired. In some rack serves, a handle is set on the tray such that a user may force thereon to pull the tray out of the chassis. However, the handle exposed out of the tray is easy to be mistakenly pulled by the user, which causes the server modules to be moved away from the chassis unexpectedly. Moreover, if a handle module of which the unlock procedure is more cumbersome is set on the tray in order to prevent the tray from being mistakenly pulled, then it may result in inconvenience to the user when repairing or replacing the server modules.

SUMMARY OF THE INVENTION

The invention provides a hidden handle module, which is easy to be operated and may prevent the tray from being pulled out unexpectedly from the chassis.

The hidden handle module of the invention is adapted to a tray. The tray is accommodated in a chassis and has a stopping portion, wherein the chassis has an interfering portion. The hidden handle module includes a shaft, a handle, a first elastic component, and a second elastic component. The shaft is pivoted in the tray and suitable for rotating to a first position and being interfered with the interfering portion to stop the tray moving out of the chassis. The handle is pivoted on the shaft and suitable for being stopped in the tray by the stopping portion to limit the shaft at the first position. The first elastic component is disposed in the tray and stopping the handle moving away from the stopping portion. The second elastic component is connected between the shaft and the tray. When the handle resists an elastic force of the first elastic component and moves away from the stopping portion, the handle protrudes out of the tray by an elastic force of the second elastic component, to drive the shaft to rotate from the first position to a second position and release an interference between the shaft and the interfering portion.

In an embodiment of the invention, the chassis has an open end, and the shaft has a first protrusion. When the shaft is located at the first position, the interfering portion is located between the open end and the first protrusion, and the interfering portion blocks the first protrusion, in order to stop the tray moving out of the chassis from the open end. When the shaft is located at the second position, the first protrusion is separated from the interfering portion.

In an embodiment of the invention, when the handle protruding out of the tray resists the elastic force of the second elastic component and moves into the tray, the shaft rotates toward the first position and the tray moves into the chassis by the first protrusion pushing the interfering portion.

In an embodiment of the invention, the chassis has an open end, and the shaft has a second protrusion. When the shaft rotates from the first position to the second position, the second protrusion is located between the open end and the interfering portion and leans on the interfering portion. When the handle receives a force to move out of the tray and drives the shaft to continue rotating from the second position to a third position, the tray moves out of the chassis from the open end by the second protrusion pushing the interfering portion.

In an embodiment of the invention, the tray has a first stopping structure. When the shaft rotates from the second position to the third position, the shaft leans on the first stopping structure to stop the shaft from further rotating.

In an embodiment of the invention, the tray has a second stopping structure. When the shaft rotates from the second position to the first position, the shaft leans on the second stopping structure to stop the shaft from further rotating.

In an embodiment of the invention, the shaft is pivoted on the tray along a first axis, and the handle is pivoted on the shaft along a second axis. A distance between the first axis and the second axis is larger than a distance between the first axis and the interfering portion.

In an embodiment of the invention, the tray has a slot. The handle is suitable for resisting the elastic force of the first elastic component to move to the slot from the stopping portion and protruding out of the tray through the slot by the elastic force of the second elastic component.

In an embodiment of the invention, the stopping portion has a recess, and the recess adjoins the slot. When the handle is limited at the stopping portion to be located in the tray, the recess exposes a portion of the handle.

In an embodiment of the invention, a width of the handle is smaller than a width of the slot, and the width of the handle is larger than a width of the recess.

In an embodiment of the invention, when the stopping portion stops the handle in the tray, the first elastic component pushes the handle toward an edge of the recess to fix the position of the handle.

In an embodiment of the invention, the first elastic component includes an elastic portion and an electromagnetic shielding portion. The elastic portion is suitable for stopping the handle moving away from the stopping portion. The electromagnetic shielding portion is suitable for shielding the slot. The handle is suitable for pressing the elastic portion to be aligned with the slot by an elastic deformation of the elastic portion. The electromagnetic shielding portion is suitable for moving away from the slot by the elastic deformation of the elastic portion.

Based on the above, in the hidden handle module of the invention, when the tray is accommodated in the chassis, the handle is stopped in the tray by the stopping portion of the tray to be hidden, so as to prevent the handle from being mistakenly pulled by a user which causes the tray and the components inside thereof to be moved away from the chassis unexpectedly. When the user wants to move the tray away from the chassis, he or she merely needs to resist the elastic force of the first elastic component to move the handle away from the stopping portion, which allows the handle to protrude out of the tray automatically by the elastic force of the second elastic component, such that the handle is adapted to be pulled to drive the tray to move out of the chassis. Accordingly, the hidden handle module is very convenient in operation.

To make the above features and advantages of the invention more comprehensible, embodiments accompanied with drawings are described in detail as follows.

DETAILED DESCRIPTION OF DISCLOSED EMBODIMENTS

Figure 1:
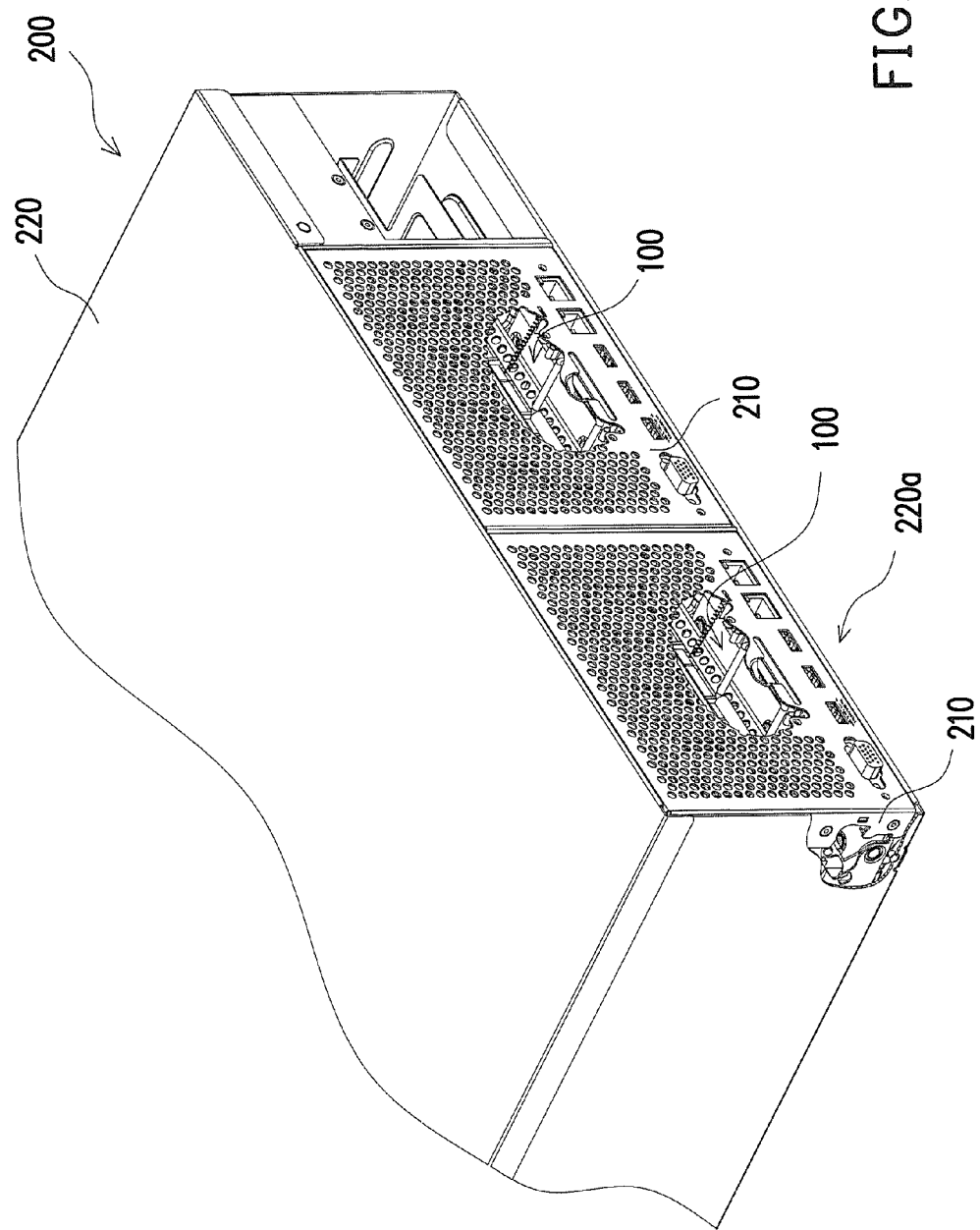
FIG. 1 illustrates a perspective view of a server which is applied with a hidden handle module according to an embodiment of the invention.
Figure 2:
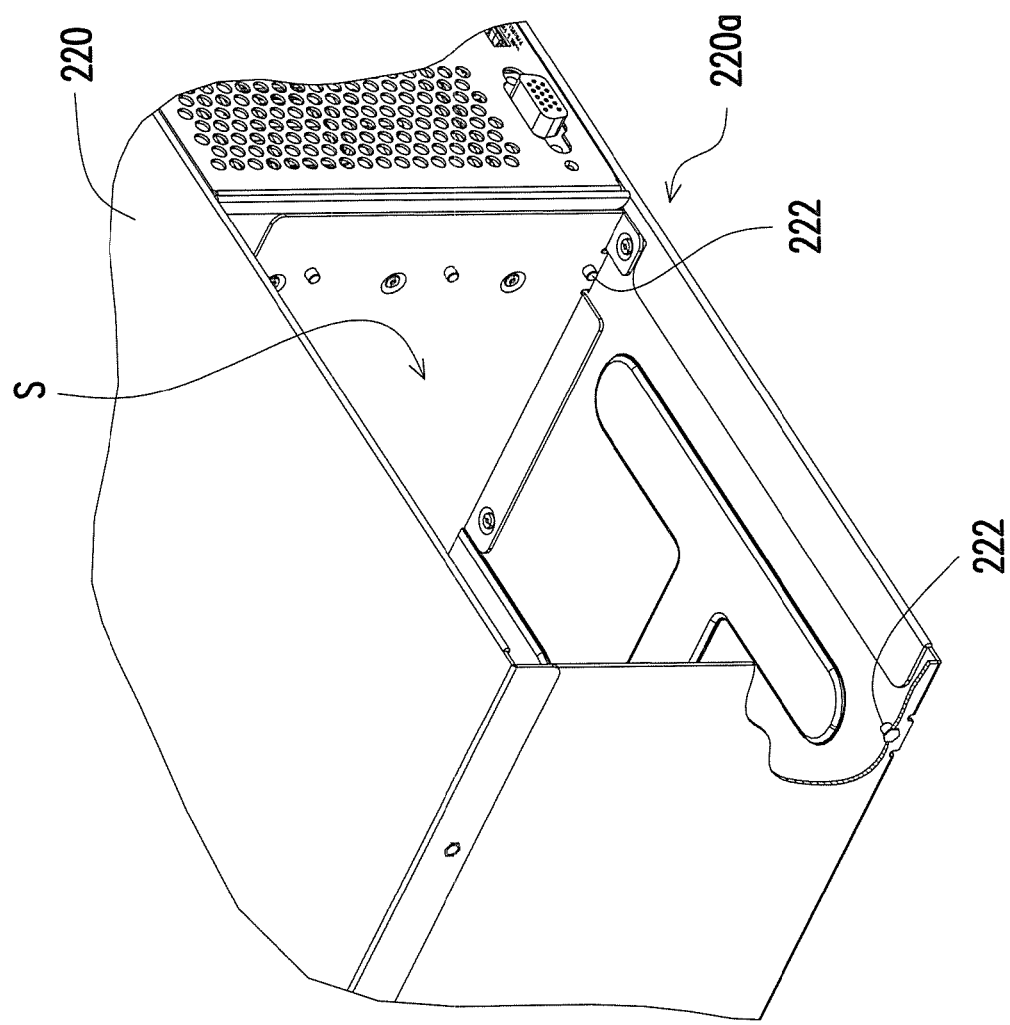
FIG. 2 illustrates a perspective view of a portion of the components of the server in FIG. 1.

FIG. 1 illustrates a perspective view of a server which is applied with a hidden handle module according to an embodiment of the invention. FIG. 2 illustrates a perspective view of a portion of the components of the server in FIG. 1. Referring to FIG. 1 and FIG. 2, a hidden handle module 100 of the invention is adapted to a tray 210 of a rack server 200. The tray 210 is accommodated in an accommodating space S of the chassis 220 of the server 200. The hidden handle module 100 is hidden in the tray 210 as shown in FIG. 1, and the hidden handle module 100 may partially protrudes out of the tray 210 for the user to pull, so as to drive the tray 210 to move out of the chassis 220 form an open end 220a of the chassis 220. Configuration and operation of the hidden handle module 100 are specifically illustrated in the following by the drawings.

Figure 3:
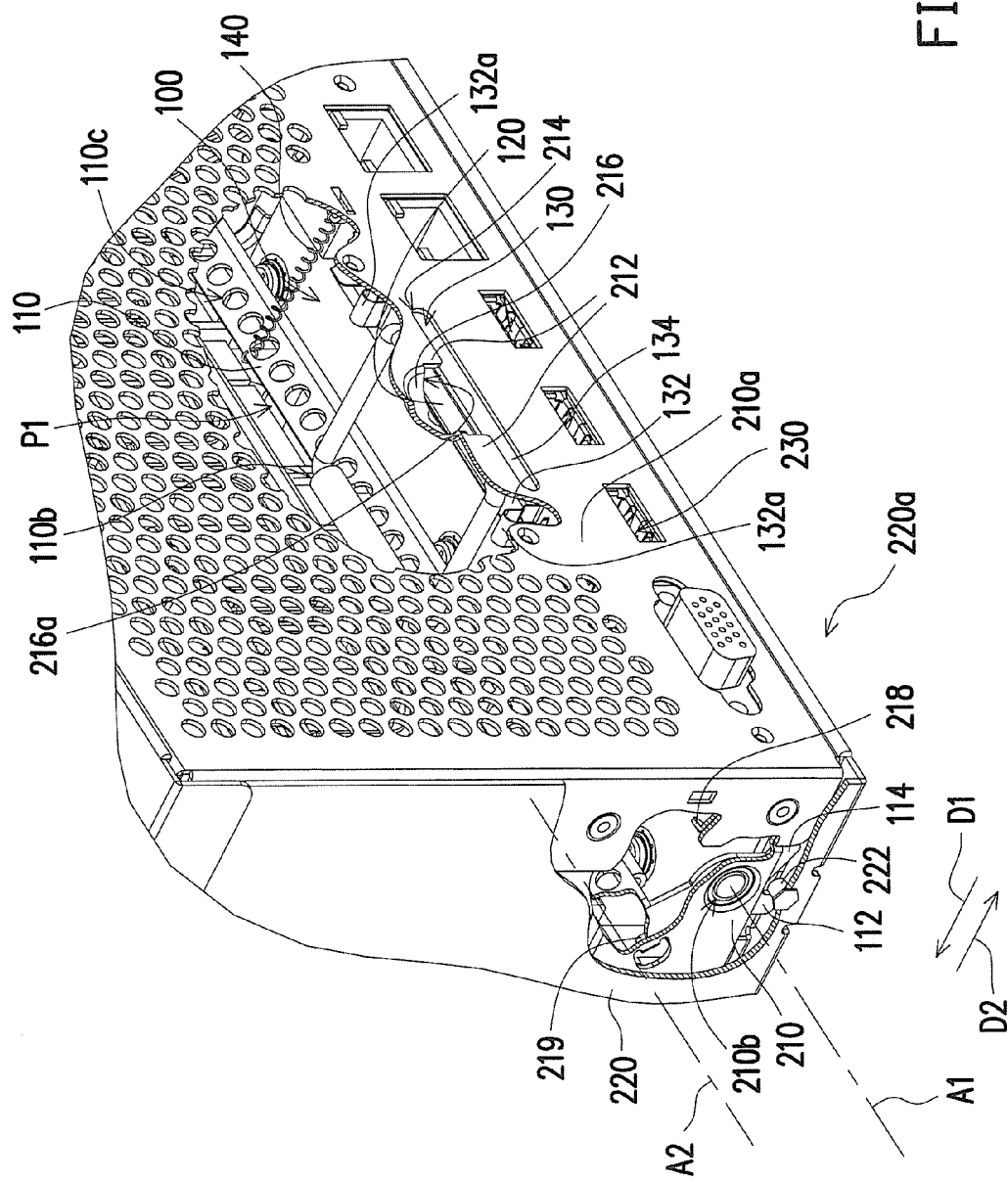
FIG. 3 illustrates a partial enlarged view of the server in FIG. 1.
Figure 4:
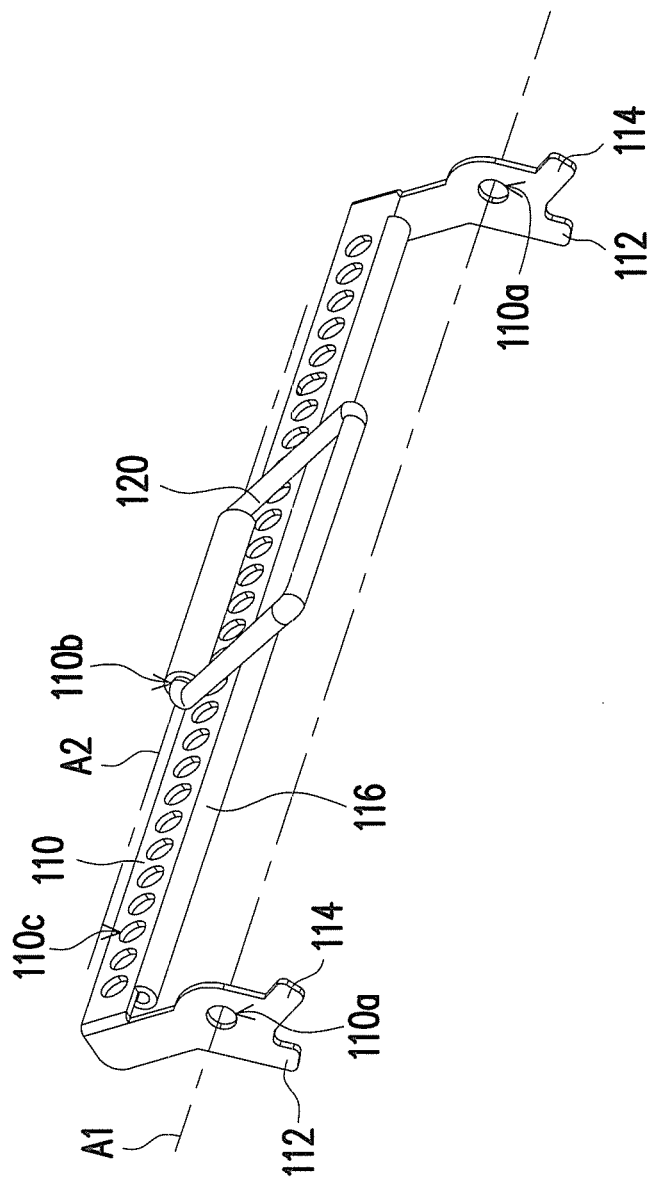
FIG. 4 illustrates a perspective view of the shaft and the handle in FIG. 3.
Figure 5:
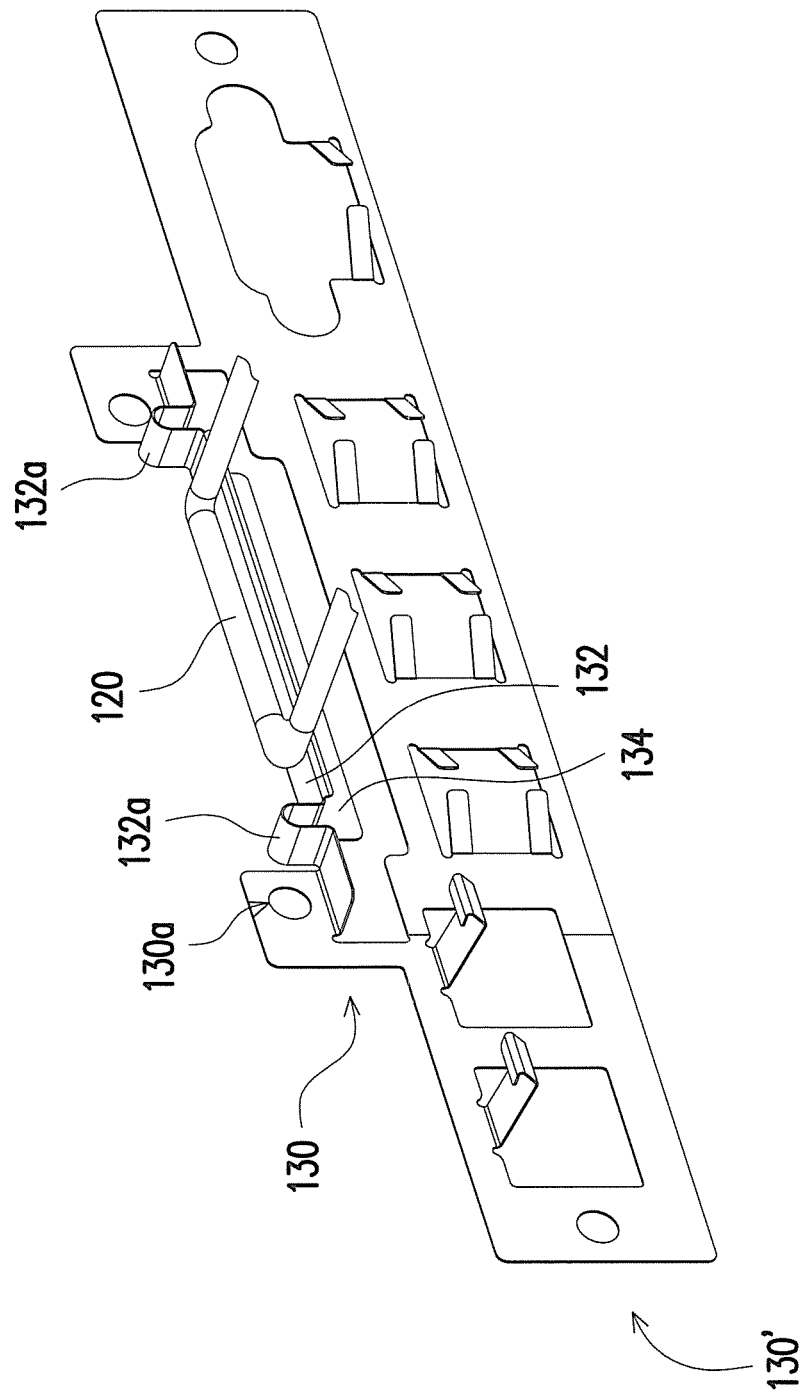
FIG. 5 illustrates a partial perspective view of the first elastic component and the handle in FIG. 3 from another perspective.

FIG. 3 illustrates a partial enlarged view of the server in FIG. 1. FIG. 4 illustrates a perspective view of the shaft and the handle in FIG. 3. FIG. 5 illustrates a partial perspective view of the first elastic component and the handle in FIG. 3 from another perspective. Referring to FIG. 3 to FIG. 5, the hidden handle module 100 of the invention includes a shaft 110, a handle 120, a first elastic component 130 and a second elastic component 140. The shaft 110 is pivoted on a pivot hole 210b of the tray 210 along a first axis A1 to be located in the tray 210. The handle 120 is pivoted on a pivot hole 110b of the shaft 110 along a second axis A2 which is parallel to the first axis A1. The first axis A1 passes through the pivot hole 210b of the tray 210 and the pivot hole 110a of the shaft 110, and the second axis A2 passes through the pivot hole 110b of the shaft 110. The first elastic component 130 is disposed in the tray 210 and includes an elastic portion 132, wherein the elastic portion 132 is, for example, a metal elastic sheet. The second elastic component 140 is, for example, an extension spring, and is connected between the shaft 110 and a panel 210a of the tray 210.

The chassis 220 has at least one interfering portion 222 (two interfering portions 222 are shown in FIG. 2), wherein the interfering portion 222 is, for example, a column. The shaft 110 has at least one first protrusion 112 (two first protrusions 112 are shown in FIG. 4) and is suitable for rotating to a first position P1 as shown in FIG. 3 to be interfered with the interfering portion 222 of the chassis 220 by the first protrusion 112 of the shaft 110. At this time, the interfering portion 222 is located between the open end 220a and the first protrusion 112 and the interfering portion 222 blocks the first protrusion 112, so as to stop the tray 210 moving out of the chassis 220 from the open end 220a by the interference state of the interfering portion 222 and the first protrusion 112.

The tray 210 has a stopping portion 212 and a slot 214, wherein the slot 214 is formed at the panel 210a of the tray 210, and the stopping portion 212 is, for example, a partial structure of the panel 210a of the tray 210 and adjoins the slot 214. The first elastic component 130 is disposed in the tray 210 and aligns with the slot 214. The handle 120 is prevented form moving away from the stopping portion 212 by the elastic portion 132 of the first elastic component 130, so that the handle 120 is stopped in the tray 210 by the stopping portion 212 and will not unexpectedly protrude out of the tray 210 through the slot 214, such that the shaft 110 pivoted on the handle 120 is limited at the first position P1 shown in FIG. 1. Accordingly, the first protrusion 112 of the shaft 110 and the interfering portion 222 of the chassis 220 may be kept in the above-mentioned interference state and limit the tray 210 at the position inside the chassis 220.

Figure 6:
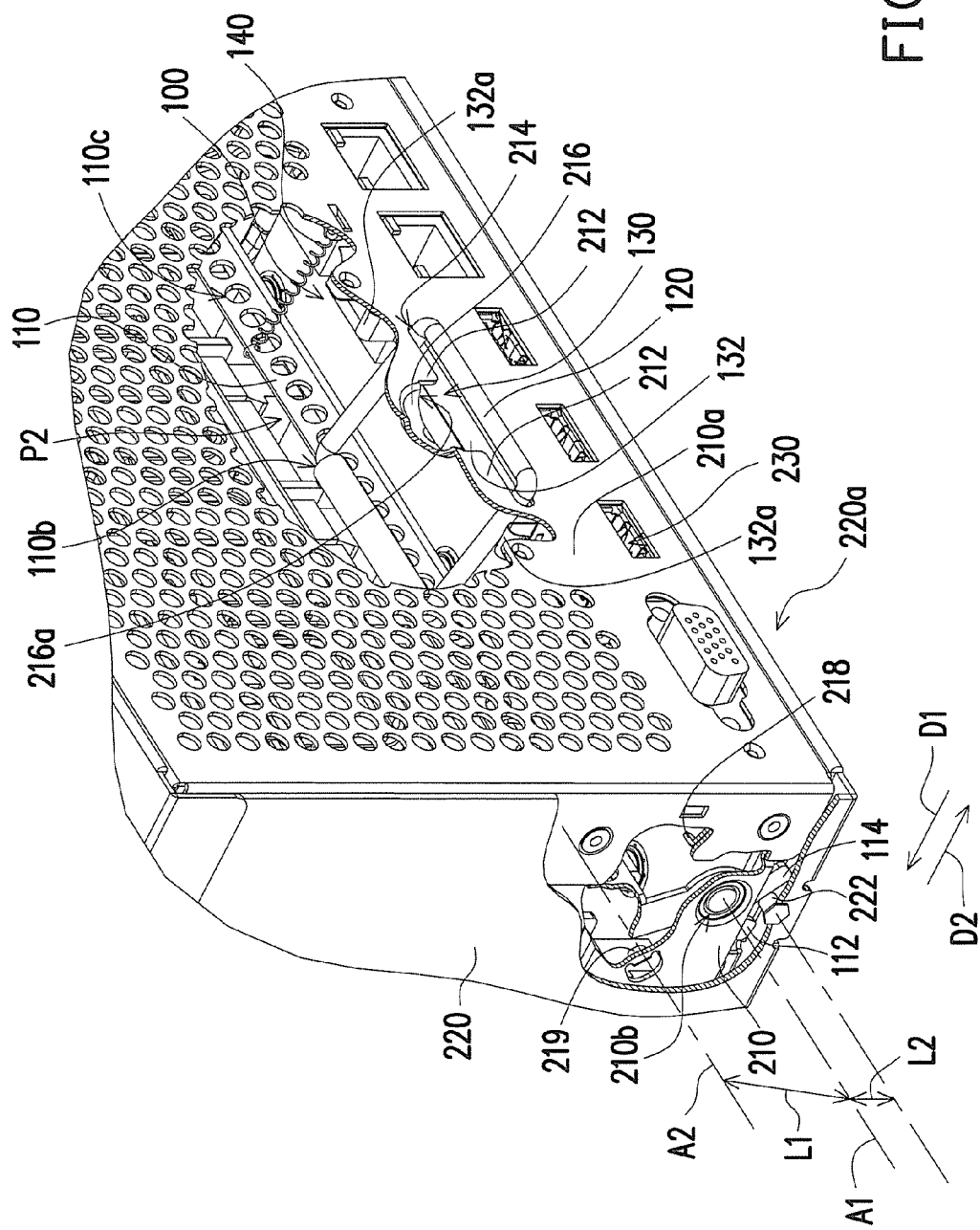
FIG. 6 illustrates the handle of FIG. 3 protruding out of the tray.

FIG. 6 illustrates the handle of FIG. 3 protruding out of the tray. Referring to FIG. 3 and FIG. 6. The panel 210a of the tray 210 of the invention has a recess 216 which adjoins the slot 214, wherein a width of the handle 120 is larger than a width of the recess 216 such that the handle 120 will not protrude out of the tray 210 through the recess 216. Moreover, the width of the handle 120 is smaller than a width of the slot 214 such that the handle 120 may protrude out of the tray 210 through the slot 214. When the handle 120 is stopped in the tray 210 by the stopping portion 212 as shown in FIG. 3, a part of the handle 120 is exposed by the recess 216 of the tray 210, the first elastic component 130 pushes the handle 120 toward an edge 216a of the recess 216 to fix the position of the handle 120, and the second elastic component 140 is extended and stores elastic potential energy. The user may force the part of the handle 120 which is exposed by the recess 216, such that the handle 120 resists elastic force of the elastic portion 132a of the first elastic component 130 and moves away from the stopping portion 212 as shown in FIG. 6. At this time, the handle 120 moves from the stopping portion 212 to the slot 214 and protrudes out of the tray 210 through the slot 214 by the elastic force of the second elastic component 140, so as to drive the shaft 110 to rotate form the first position P1 shown in FIG. 3 to a second position P2 shown in FIG. 6. When the shaft 110 is located at the second position P2, the first protrusion 112 of the shaft 110 is separated from the interfering portion 222 of the chassis 220, and the interference of the first protrusion 112 and the interfering portion 222 is released.

By the above-mentioned configuration and operation of the hidden handle module 100, when the tray 210 is accommodated in the chassis 220 as shown in FIG. 3, the handle 120 is stopped in the tray 210 by the stopping portion 212 of the tray 210 to be hidden, so as to prevent the handle 120 from being mistakenly pulled by the user which causes the tray 210 and the components inside thereof to be moved away from the chassis 220 unexpectedly. When the user wants to move the tray 210 away from the chassis 220, he or she merely needs to resist the elastic force of the first elastic component 130 to move the handle 120 away from the stopping portion 212, which allows the handle 120 to protrude out of the tray 210 automatically by the elastic force of the second elastic component 140, such that the handle 120 is adapted to be pulled to drive the tray 210 to move out of the chassis 220. Accordingly, the hidden handle module 100 is very convenient in operation.

In the embodiment, the amount of the tray 210 is two as shown in FIG. 1, and the amount of the hidden handle module 100 is also two accordingly. However, the invention is not limited thereto. In other embodiments, the tray 210 and the hidden handle module 100 may be of other suitable amount. Moreover, in other embodiments, the hidden handle module 100 may be adapted to trays of other kinds of apparatuses, and the invention is not limited thereto.

Figure 7:
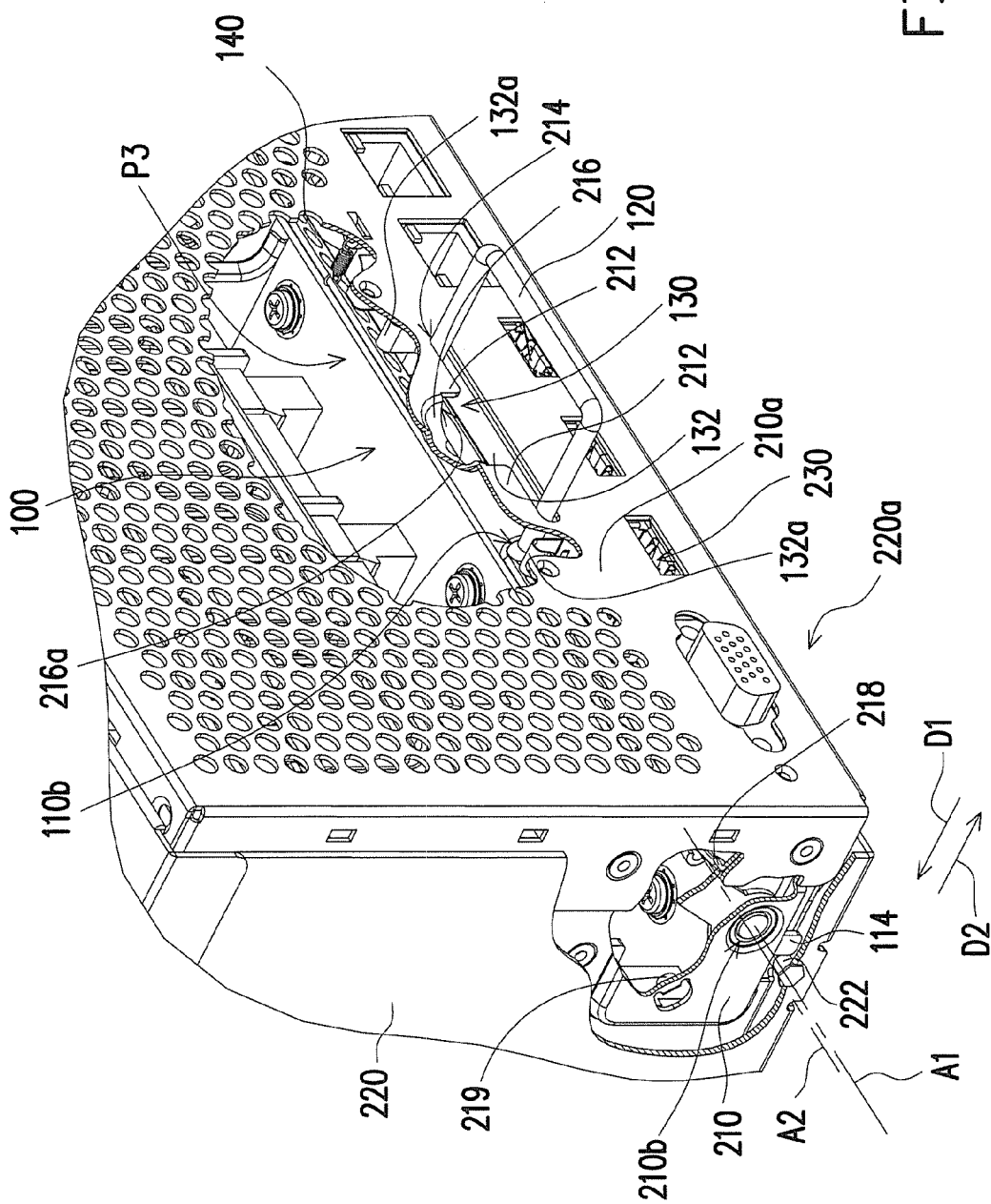
FIG. 7 illustrates the handle of FIG. 6 moving out of the tray.

FIG. 7 illustrates the handle of FIG. 6 moving out of the tray. Referring to FIG. 3, FIG. 4, and FIG. 6, the shaft 110 of the invention further has at least one second protrusion 114 (two second protrusions 114 are shown in FIG. 4). When the shaft 110 rotates form the first position P1 shown in FIG. 3 to the second position P2 shown in FIG. 6, the second protrusion 114 is located between the open end 220a of the chassis 220 and the interfering portion 222 and leans on the interfering portion 222. Then, when the handle 120 receives a force to move out of the tray 210 and drives the shaft 110 to continue rotating from the second position P2 shown in FIG. 6 to a third position P3 shown in FIG. 7, a displacement of the second protrusion 114 in a direction D1 with respect to the tray 210 is produced with the rotation of the shaft 110, such that the tray 210 moves out of the chassis 220 from the open end 220a along a direction D2 reversed to the direction D1 as shown in FIG. 7 by the second protrusion 114 pushing the interfering portion 222 of the chassis 220 along the direction D1. Accordingly, the tray 210 may be pulled out smoothly from the chassis 220 by the user.

As shown in FIG. 6, in the embodiment, a distance L1 between the first axis A1 and the second axis A2 is larger than a distance L2 between the first axis A1 and the interfering portion 222. Accordingly, in a process that the user forces the handle 120 and drives the shaft 110 to be actuated, an effort-saving effect may be achieved due to the fact that a lever min between the first axis A1 and the interfering portion 222 (corresponding to the distance L1) is larger than a lever arm between the second axis A2 and the interfering portion 222 (corresponding to the distance L2).

When the user wants to place the tray 210 shown in FIG. 7 into the chassis 220, he or she may force the handle 120 along the direction D1, such that the handle 120 protruding out of the tray 210 resists elastic force of the second elastic component 140 and moves into the tray 210, such that the shaft 110 is driven to rotate toward the first position P1 shown in FIG. 3. At this time, a displacement of the first protrusion 112 in the direction D2 is produced with respect to the tray 210 with the rotation of the shaft 110, such that the tray 210 moves into the chassis 220 along the direction D1 reversed to the direction D2 by the first protrusion 112 pushing the interfering portion 222 of the chassis 220 along the direction D2.

Referring to FIG. 3, FIG. 6, and FIG. 7. In the embodiment, the tray 210 has a first stopping structure 218 and a second stopped structure 219 for limiting rotating range of the shaft 110. Specifically, when the shaft 110 rotates from the second position P2 shown in FIG. 6 to the third position P3 shown in FIG. 7, the shaft 110 may lean on the first stopping structure 218 to stop the shaft 110 from further rotating. Similarly, when the shaft 110 rotates from the second position P2 shown in FIG. 6 to the first position P1 shown in FIG. 3, the shaft 110 may lean on the second stopped structure 219 to stop the shaft 110 from further rotating.

Referring to FIG. 3 and FIG. 5, the first elastic component 130 of the invention is, for example, an integrated metal punched component and is riveted on the panel 210a of the tray 210 by a riveting hole 130a of the first elastic component 130. Moreover, the first elastic component 130 is, for example, extended from an electromagnetic protecting structure (such as an electromagnetic protecting structure 130' which corresponds to an input/output port 230) of the tray 210. The first elastic component 130 not only includes the elastic portion 132, but also includes an electromagnetic shielding portion 134. When the handle 120 is stopped inside the tray 210 by the stopping portion 212 as shown in FIG. 3, the slot 214 is shielded by the electromagnetic shielding portion 134 of the first elastic component 130, so as to prevent electromagnetic wave inside the chassis 220 from leaking out through the slot 214. When the handle 120 presses the elastic portion 132 of the first elastic component 130 such that the handle 120 aligns with the slot 214 as shown in FIG. 6 by elastic deformation of the elastic portion 132, the electromagnetic shielding portion 134 of the first elastic component 130 may move away from the slot 214 by elastic deformation of the elastic portion 132, such that the handle 120 may protrude out of the tray 210 through the slot 214. The elastic portion 132 of the invention is, for example, capable of producing sufficient amount of elastic deformation by the elastic portion 132a thereof. In other embodiments, the elastic portion 132 may be other suitable shapes, and the invention is not limited thereto.

Referring to FIG. 4, the shaft 110 of the invention is, for example, an integrated metal component with a plurality of openings 110c, so as to reduce wind resistance of the shaft 110 to cooling airflow in the chassis 220. As shown in FIG. 3, the shaft 110 is, for example, connected to an end of the second elastic component 140 by one of the openings 110c. Furthermore, the shaft 110 further has a roll-shaped structure 116 formed by bending, so as to enhance structural strength of the shaft 110.

In summary, in the hidden handle module of the invention, when the tray is accommodated in the chassis, the handle is stopped in the tray by the stopping portion of the tray to limit the position of the shaft, such that the tray is limited inside the chassis by the interference of the shaft and the chassis, and the handle in the state is hidden in the tray, so as to prevent the handle from being mistakenly pulled by the user which causes the tray and the components inside thereof to be moved away from the chassis unexpectedly. When the user wants to move the tray away from the chassis, he or she merely needs to resist the elastic force of the first elastic component to move the handle away from the stopping portion, which allows the handle to protrude out of the tray automatically by the elastic force of the second elastic component and drive the shaft to rotate to release the interference of the shaft and the chassis, such that the handle is adapted to be pulled to drive the tray to move out of the chassis. Accordingly, the hidden handle module is very convenient in operation.

Although the invention has been described with reference to the above embodiments, it will be apparent to persons of ordinary skill in the art that modifications to the described embodiments may be made without departing from the spirit of the invention. Accordingly, the scope of the invention will be defined by the attached claims and not by the above detailed descriptions.

What is claimed is:

1. A hidden handle module, adapted to a tray, the tray accommodated in a chassis and has a stopping portion, the chassis has an interfering portion, the hidden handle module comprising:
   a shaft, pivoted in the tray and suitable for rotating to a first position and being interfered with the interfering portion to stop the tray moving out of the chassis;
   a handle, pivoted on the shaft and suitable for being stopped in the tray by the stopping portion to limit the shaft at the first position;
   a first elastic component, disposed in the tray and stopping the handle moving away from the stopping portion; and
   a second elastic component, connected between the shaft and the tray, wherein when the handle resists an elastic force of the first elastic component and moves away from the stopping portion, the handle protrudes out of the tray by an elastic force of the second elastic component to drive the shaft to rotate from the first position to a second position and release an interference between the shaft and the interfering portion.

2. The hidden handle module as claimed in claim 1, wherein the chassis has an open end, the shaft has a first protrusion, when the shaft is located at the first position, the interfering portion is located between the open end and the first protrusion and blocks the first protrusion to stop the tray moving out of the chassis from the open end, and when the shaft is located at the second position, the first protrusion is separated from the interfering portion.

3. The hidden handle module as claimed in claim 2, wherein when the handle protruding out of the tray resists the elastic force of the second elastic component and moves into the tray, the shaft rotates toward the first position and the tray moves into the chassis by the first protrusion pushing the interfering portion.

4. The hidden handle module as claimed in claim 2, the shaft has a second protrusion, when the shaft rotates from the first position to the second position, the second protrusion is located between the open end and the interfering portion and leans on the interfering portion, and when the handle receives a force to move out of the tray and drives the shaft to continue rotating from the second position to a third position, the tray moves out of the chassis from the open end by the second protrusion pushing the interfering portion.

5. The hidden handle module as claimed in claim 4, wherein the tray has a first stopping structure, and when the shaft rotates from the second position to the third position, the shaft leans on the first stopping structure to stop the shaft from further rotating.

6. The hidden handle module as claimed in claim 5, wherein the tray has a second stopping structure, and when the shaft rotates from the second position to the first position, the shaft leans on the second stopping structure to stop the shaft from further rotating.

7. The hidden handle module as claimed in claim 1, wherein the shaft is pivoted on the tray along a first axis, the handle is pivoted on the shaft along a second axis, and a distance between the first axis and the second axis is larger than a distance between the first axis and the interfering portion.

8. The hidden handle module as claimed in claim 1, wherein the tray has a slot, the handle is suitable for resisting the elastic force of the first elastic component to move to the slot from the stopping portion and protruding out of the tray through the slot by the elastic force of the second elastic component.

9. The hidden handle module as claimed in claim 8, wherein the stopping portion has a recess, the recess adjoins the slot, and when the handle is limited at the stopping portion to be located in the tray, the recess exposes a portion of the handle.

10. The hidden handle module as claimed in claim 9, wherein a width of the handle is smaller than a width of the slot, and the width of the handle is larger than a width of the recess.

11. The hidden handle module as claimed in claim 9, wherein when the stopping portion stops the handle in the tray, the first elastic component pushes the handle toward an edge of the recess to fix the position of the handle.

12. The hidden handle module as claimed in claim 8, wherein the first elastic component comprises an elastic portion and an electromagnetic shielding portion, the elastic portion is suitable for stopping the handle moving away from the stopping portion, the electromagnetic shielding portion is suitable for shielding the slot, the handle is suitable for pressing the elastic portion to be aligned with the slot by an elastic deformation of the elastic portion, and the electromagnetic shielding portion is suitable for moving away from the slot by the elastic deformation of the elastic portion.

* * * * *